United States Patent [19]

Duboz et al.

[11] Patent Number: 5,726,500
[45] Date of Patent: Mar. 10, 1998

[54] SEMICONDUCTOR HYBRID COMPONENT

[75] Inventors: Jean-Yves Duboz, Cachan; Emmanuel Rosencher, Bagneux; Philippe Bois, Cesson, all of France

[73] Assignee: Thomson-CSF, Paris, France

[21] Appl. No.: 549,812

[22] PCT Filed: Apr. 7, 1995

[86] PCT No.: PCT/FR95/00448

§ 371 Date: Dec. 7, 1995

§ 102(e) Date: Dec. 7, 1995

[87] PCT Pub. No.: WO95/28006

PCT Pub. Date: Oct. 19, 1995

[30] Foreign Application Priority Data

Apr. 8, 1994 [FR] France ................. 94 04168
Jun. 21, 1994 [FR] France ................. 94 07573

[51] Int. Cl.⁶ ............... H01L 27/146; H01L 23/50; H01L 23/48; H01L 29/44
[52] U.S. Cl. ............... 257/777; 257/780; 257/723; 257/738; 257/693; 257/735
[58] Field of Search ............... 257/777–781, 257/737, 738, 723, 730, 735, 668, 693

[56] References Cited

U.S. PATENT DOCUMENTS

| | | | |
|---|---|---|---|
| 3,380,155 | 4/1968 | Burks | 257/778 |
| 3,823,348 | 7/1974 | Agusta et al. | 257/778 |
| 4,021,838 | 5/1977 | Warwick | 257/778 |
| 4,122,479 | 10/1978 | Sugawara et al. | 257/777 |
| 4,250,520 | 2/1981 | Denlinger | 257/737 |
| 4,675,717 | 6/1987 | Herrero et al. | 257/777 |
| 4,774,630 | 9/1988 | Reisman et al. | 257/778 |
| 5,086,327 | 2/1992 | Rosencher et al. | 257/200 |
| 5,187,715 | 2/1993 | Weisbuch et al. | 257/21 |
| 5,212,406 | 5/1993 | Reele et al. | 257/778 |
| 5,228,777 | 7/1993 | Rosencher et al. | 257/198 |
| 5,289,637 | 3/1994 | Koopman et al. | 257/737 |
| 5,311,278 | 5/1994 | Rosencher | 356/326 |
| 5,326,984 | 7/1994 | Rosencher et al. | 257/21 |
| 5,463,249 | 10/1995 | Shinhu et al. | 257/723 |
| 5,506,418 | 4/1996 | Bois et al. | 257/21 |
| 5,543,641 | 8/1996 | Wadsworth et al. | 252/249 |

FOREIGN PATENT DOCUMENTS

| | | | |
|---|---|---|---|
| 59-52859 | 3/1984 | Japan | 257/777 |
| 0062961 | 2/1992 | Japan | 257/737 |
| 0036894 | 2/1993 | Japan | 257/737 |
| 0243482 | 9/1993 | Japan | 257/777 |
| 6-151701 | 5/1994 | Japan | 257/777 |
| 6-236981 | 8/1994 | Japan | 257/777 |

*Primary Examiner*—Tom Thomas
*Assistant Examiner*—Alexander Oscar Williams
*Attorney, Agent, or Firm*—Oblon, Spivak, McClelland, Maier & Neustadt, P.C.

[57] ABSTRACT

Semiconductor hybrid components, especially linear infrared detectors produced by hybridization. A main substrate has integrated thereon active elements which cannot be produced on a silicon substrate. The substrate is made, for example, of AsGa, InP, HgCdTe or PbTe. Several silicon chips are mounted on the main substrate, by hybridization using indium balls. These chips include the read and multiplexing circuits. The silicon chips remain of limited size (a few millimeters) so that the differential thermal expansion stresses are limited, but the detection array may be produced as one piece without butt-joining. It is therefore possible to produce arrays of great length (several centimeters) and of high resolution (at least a thousand points).

20 Claims, 5 Drawing Sheets

SEMICONDUCTOR HYBRID COMPONENT

BACKGROUND OF THE INVENTION

1. Field of the Invention

The field of the invention is that of semiconductor components and especially, but not exclusively, that of infrared detectors.

2. Discussion of the Background

Currently, infrared detectors exist made of semiconductor materials such as III-V compounds (especially GaAs and InP), IV-VI compounds (such as PbTe) or II-VI compounds (such as HgCdTe) having very good detection performance characteristics. Nevertheless, these materials are not suitable for easily producing circuits for reading the detected photoelectric charges or circuits for processing the signals coming from this reading. Rather, these circuits must be produced from silicon, the technology of which is now well controlled and therefore inexpensive. This is why, both for infrared detectors and for other functions, there have been endeavours to develop mixed silicon/other semiconductor material devices.

In particular, attempts have been made to deposit gallium arsenide on a silicon substrate: the gallium-arsenide-based layers, deposited on a part of the silicon substrate, serve to form the active elements which cannot be produced with silicon; the rest of the substrate is used to produce silicon-based read and processing circuits. However, this solution, although conceivable for gallium arsenide, is difficult to implement and is not, moreover, suitable for other infrared detection materials such as HgCdTe or PbTe.

Another solution, currently widely used industrially, consists in making a hybrid arrangement combining an integrated component on a silicon substrate and an integrated component on a substrate of different material (GaAs, InP, HgCdTe or PbTe). In the case of infrared detectors, the hybridization technology most used consists in using as the main hybridization substrate a silicon substrate on which read and electronic processing circuits are integrated, and in bonding to this integrated circuit, face to face, a detection circuit formed on a substrate other than silicon and including the photosensitive elements. FIG. 1 shows such an arrangement in the conventional case of hybridization using indium balls. The detection circuit (substrate 10 of material such as GaAs for example) includes contact pads 12 connected to photosensitive elements 14; the silicon substrate 15 includes contact pads 16 connected to corresponding inputs of the read circuits formed on this substrate. The pads of both integrated components are arranged exactly facing each other and are bonded together by means of indium balls 18. The hybridization of the two substrates is therefore performed by bonding all the facing contact pads, this bonding establishing both mechanical connection of the two substrates and the electrical connection point by point between each of the photosensitive elements and their respective read circuits. The silicon substrate, the main substrate in the hybridization, moreover includes input/output contact pads 22 for connection with the outside.

Nevertheless, this hybridization technique has limits. The reason for this is that a large difference exists between the coefficients of thermal expansion of silicon and those of the other semiconductors. Now, whereas the hybridization is produced above room temperature, the active elements (infrared detector type) are intended to operate at very low temperatures (around 77 kelvin); moreover, indium is chosen for its great capacity to absorb the stresses which are produced on going from room temperature to the very low use temperature. However, even if the mechanical stresses are reduced, the differences in coefficient of expansion of the two substrates remain and mean that contact pads which are facing each other on the two substrates at a given temperature may no longer be so at another temperature. This is the case when contacts are very close together. This may cause short-circuits or other defects making correct operation .of the component impossible.

In order to avoid this problem, it is therefore necessary greatly to limit the dimensions of the substrate carrying the detection elements. Most often, the size of the infrared detection arrays under these conditions cannot exceed approximately 10 mm. If it is desired to produce longer arrays, it is then necessary to butt join several arrays of a few millimeters, each on the silicon main substrate. However, this butt-joining introduces areas devoid of detectors (missing pixels in the scanned image), something which is not desirable.

Another limitation of this hybridization technology is in the size of the indium balls which must be large enough (several tens of micrometers in width) to allow correct bonding between the two substrates. This size makes compatibility with the use of a large number of very close contacts between the two substrates difficult: for example, it is not possible to employ this technique for high-resolution photodiode arrays having many detection elements and contacts above these elements (the conventional case): if the contact pads are to be distributed along a line of 10 millimeters at most, with a pitch of 60 micrometers, it is hardly possible to go beyond 150 elements in the array. This technology therefore cannot be easily used when maximum densification of the active functions is sought on semiconductor substrates whose size is, moreover, limited as a result of thermal stresses.

Attempts have also been made to attach photodiode arrays as well as silicon chips on an intermediate substrate having a coefficient of thermal expansion which is intermediate between that of silicon and that of the substrate carrying the active elements. The problems due to the different expansion coefficients is thus partially, but not sufficiently, limited.

SUMMARY OF THE INVENTION

In order to solve these various problems, the invention proposes a novel type of hybrid semiconductor component whose novelty stems from the fact that it includes several silicon integrated circuits of limited size, attached to a larger substrate (made of material different from silicon) on which are integrated the active elements which cannot be produced on a silicon substrate. The number and pitch of these active elements is then no longer limited by the problems of differential expansion nor by the stresses associated with the indium balls; for infrared detectors especially, it becomes possible to produce long high-resolution arrays as one piece (no butt-joining operation).

The hybrid semiconductor component according to the invention preferably comprises a main substrate made of a material other than silicon, in which are integrated, on the one hand, active elements and, on the other hand, contact pads and connections between each active element and a respective contact pad, and several integrated-circuit silicon chips in which are integrated, on the one hand, electronic circuits intended to be connected to the active elements of the main substrate and, on the other hand, contact pads facing those of the main substrate, the silicon chips being bonded to the main substrate via the facing contact pads.

The material of the main substrate will usually be a semiconductor material, especially one from the III-V, II-VI or IV-VI classes, and most particularly GaAs, InP, PbTe or HgCdTe.

The invention is, in fact, particularly attractive for producing linear or multilinear arrays for detecting radiation, especially infrared radiation. It is very advantageously used for detectors of the type intended to be cooled to a very low temperature. The silicon chips may be chips of a few millimeters a side, for which dimensions the differential thermal expansion stresses remain acceptable and which make it possible, however, already to integrate many complex electronic functions: functions of reading charges arising from groups of several photosensitive elements and functions of multiplexing the signals arising from this reading.

The contact pads on the main substrate carrying the photosensitive active elements are preferably offset with respect to these elements so that they may have a size and a spacing pitch greater than the size and spacing pitch of the active elements. It will also be possible to arrange for the silicon chips, bonded to these offset contacts, not to cover the photosensitive active elements, so as to allow illumination of these detectors via the front face of the first substrate (the face carrying the silicon chips and the active elements). In the prior techniques of hybridization using indium balls, the illumination must necessarily be via the rear face, which makes it necessary to use techniques for thinning the substrate carrying the photosensitive elements. These techniques are expensive and lead to reductions in fabrication yield.

BRIEF DESCRIPTION OF THE DRAWINGS

The invention will be better understood by virtue of the following description, given by way of non-limiting example, and by virtue of the appended figures in which.

DETAILED DESCRIPTION OF THE PREFERRED EMBODIMENTS

Figure 1:
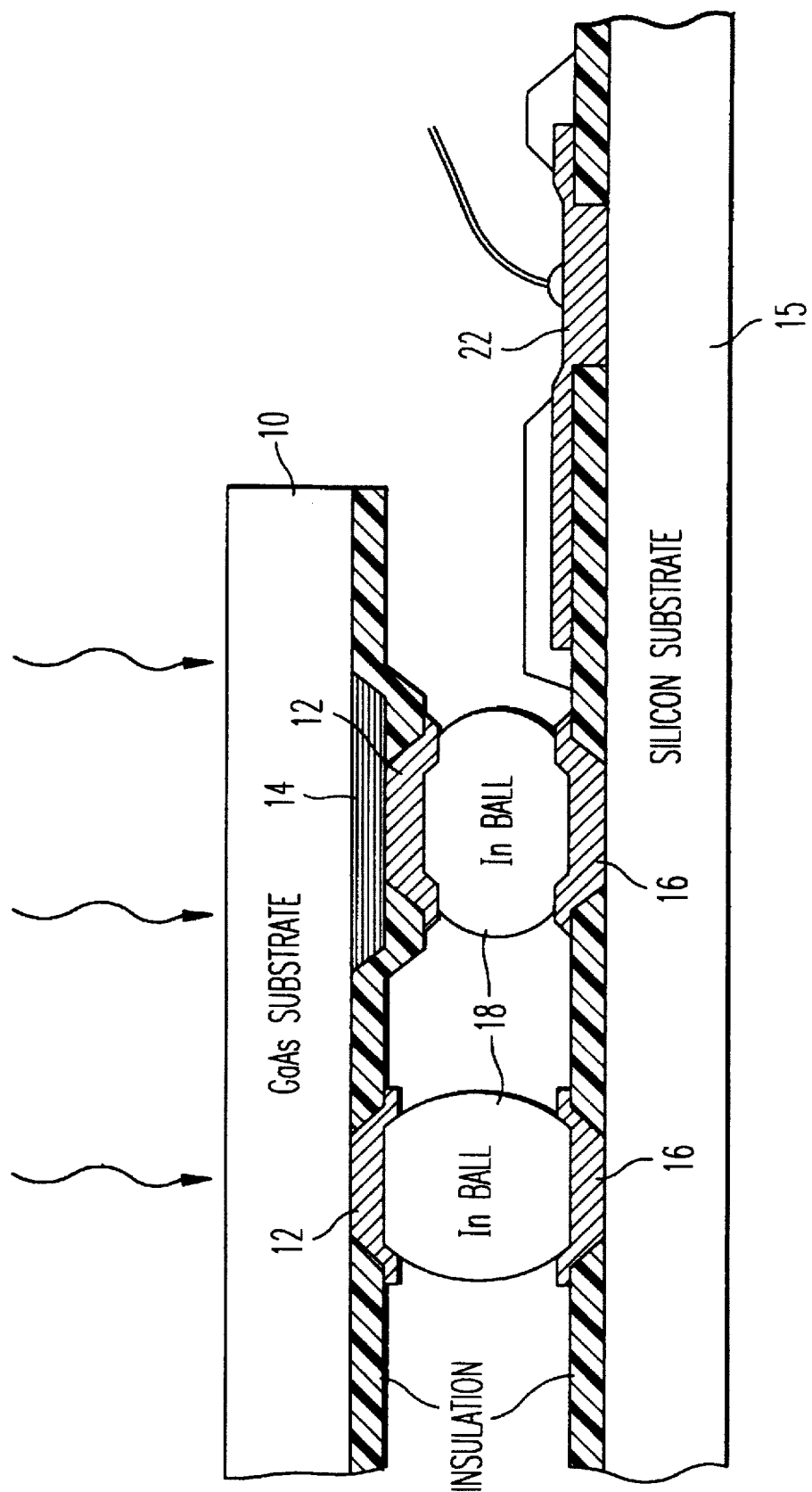
FIG. 1, already described, represents a hybrid component according to the prior art, using a silicon main substrate.
Figure 2:
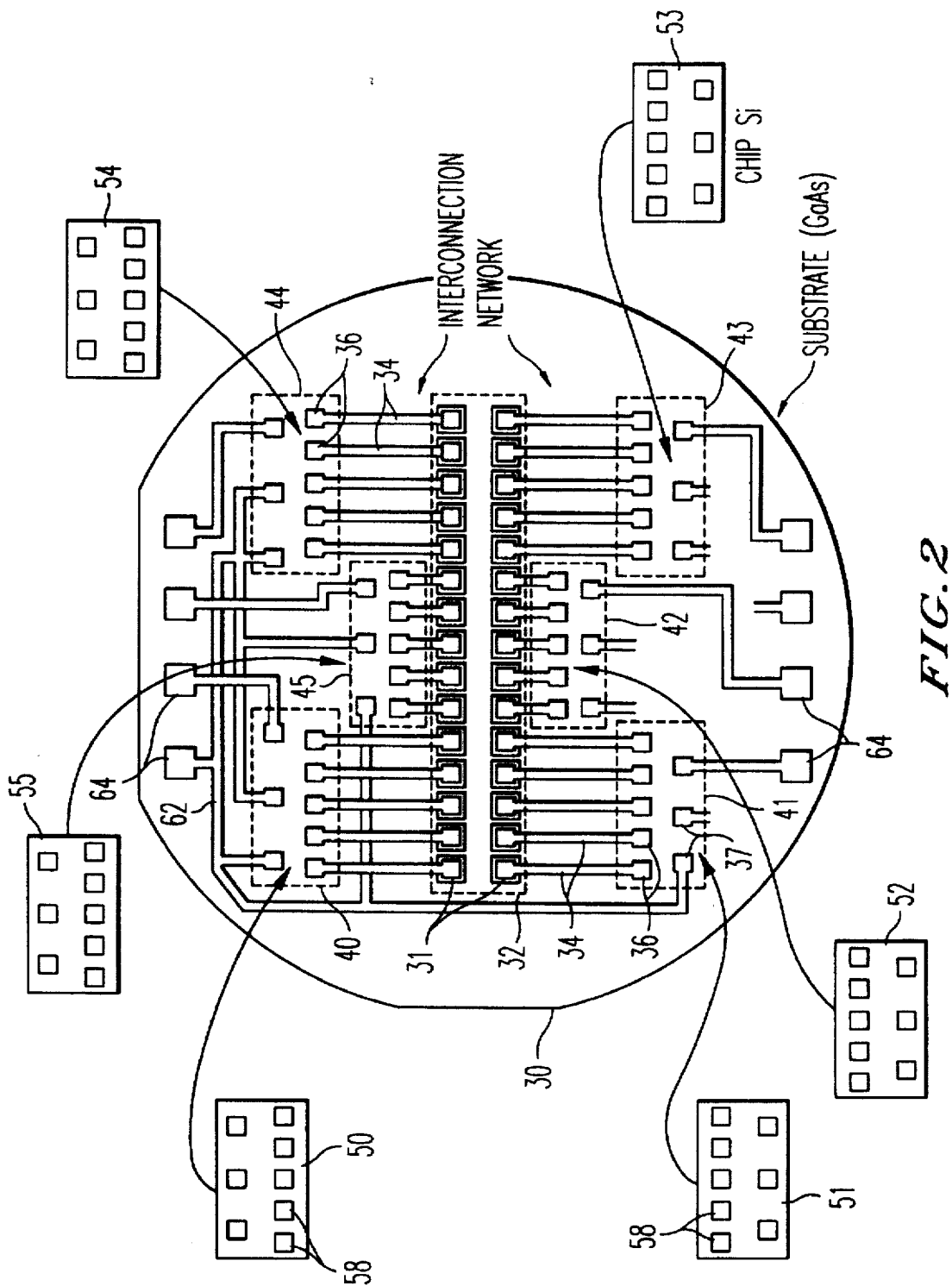
FIG. 2 represents the principle of the invention, consisting in placing several silicon circuits on a main substrate made of different material.

FIG. 2 shows, in plan view, the principle of the invention. In the conventional hybridization techniques used for linear, multilinear or matrix infrared detectors, the hybridization main substrate was the silicon substrate to which the detection circuit, including the photosensitive elements, was bonded (cf. FIG. 1). Here, the hybridization main substrate is the substrate-which carries the active elements; it is not made of silicon because of the fact that the active elements cannot be produced, or not easily produced, on a silicon substrate. By "main substrate" is meant here the substrate which includes pads for connecting the hybrid component to the outside. By "active element" is meant here elements other than simple conducting connections; for a radiation detector, the active elements are the photosensitive elements which, for example, may be photodiodes.

The main substrate 30 is shown here as an entire circular wafer of gallium arsenide (GaAs), for example a wafer of 3 inches, i.e. 7.5 cm, in diameter, but the main substrate may, of course, be a rectangular chip cut out from a wafer. The substrate may also be made of indium phosphide (InP), of HgCdTe or of PbTe, etc., depending on the type of radiation it is desired to detect.

The photosensitive elements 31 are directly integrated in this main substrate, using diffusion, deposition, masking, selective or non-selective etching techniques commonly used in the fabrication of integrated semiconductors. The area in which these photosensitive elements are integrated is surrounded by a dotted line 32 in FIG. 2. Conducting connections 34, produced in principle by deposition and etching of a metallic layer, are also integrated on the substrate 30. These connections individually connect the photosensitive elements 31 to contact pads 36 which are laterally offset with respect to these elements. These contact pads are distributed in groups in several different areas 40, 41, 42, 43, 44, 45 of the main substrate 30. Each area corresponds to the location of a respective silicon integrated circuit 50, 51, 52, 53, 54, 55 to be bonded to the main substrate. The silicon integrated-circuit chips are shown alongside the main substrate 30. They are shown with their front face visible but are intended to be turned upside down in order to be bonded via their front face to the main substrate. They include, on this front face, contact pads 58 whose positions correspond exactly, after turning the chip upside down, to those of the contact pads of the areas 40 to 45. The silicon chips include electronic circuits and, especially in the case of infrared detectors, read and multiplexing circuits enabling signals representing the illuminations individually received by each of the photosensitive elements 31 to be read individually and transmitted sequentially to the outputs of the hybrid component. In principle, each photosensitive element 31 of the main substrate 30 is connected to a respective read circuit of a silicon chip. The photosensitive active elements are all located on the single main substrate, but the read circuits are distributed on the various silicon chips.

Among the contact pads in the areas 40 to 45 of the substrate 30, there are not only the pads 36 connected to the active elements 31, but also pads 37 connected to other connections 62 integrated on the main substrate 30. These other connections go either to input/output contact pads 64, located outside the areas 40 to 45 and the area 32 and serving for connection of the component with the outside, or to other silicon chips. The input/output pads 64 may serve, for example, as bonding points in order to receive flexible wires which connect them to connection terminals of a package containing the hybrid component. The arrangement may be such that certain silicon chips are connected by connections 62 to other silicon chips, without being connected to the photosensitive elements. This would be the case, for example, for a silicon chip serving just to multiplex the signals arising from the other chips, the latter each containing read circuits of a limited group of photosensitive elements and multiplexing circuits limited to this group of elements.

Figure 3:
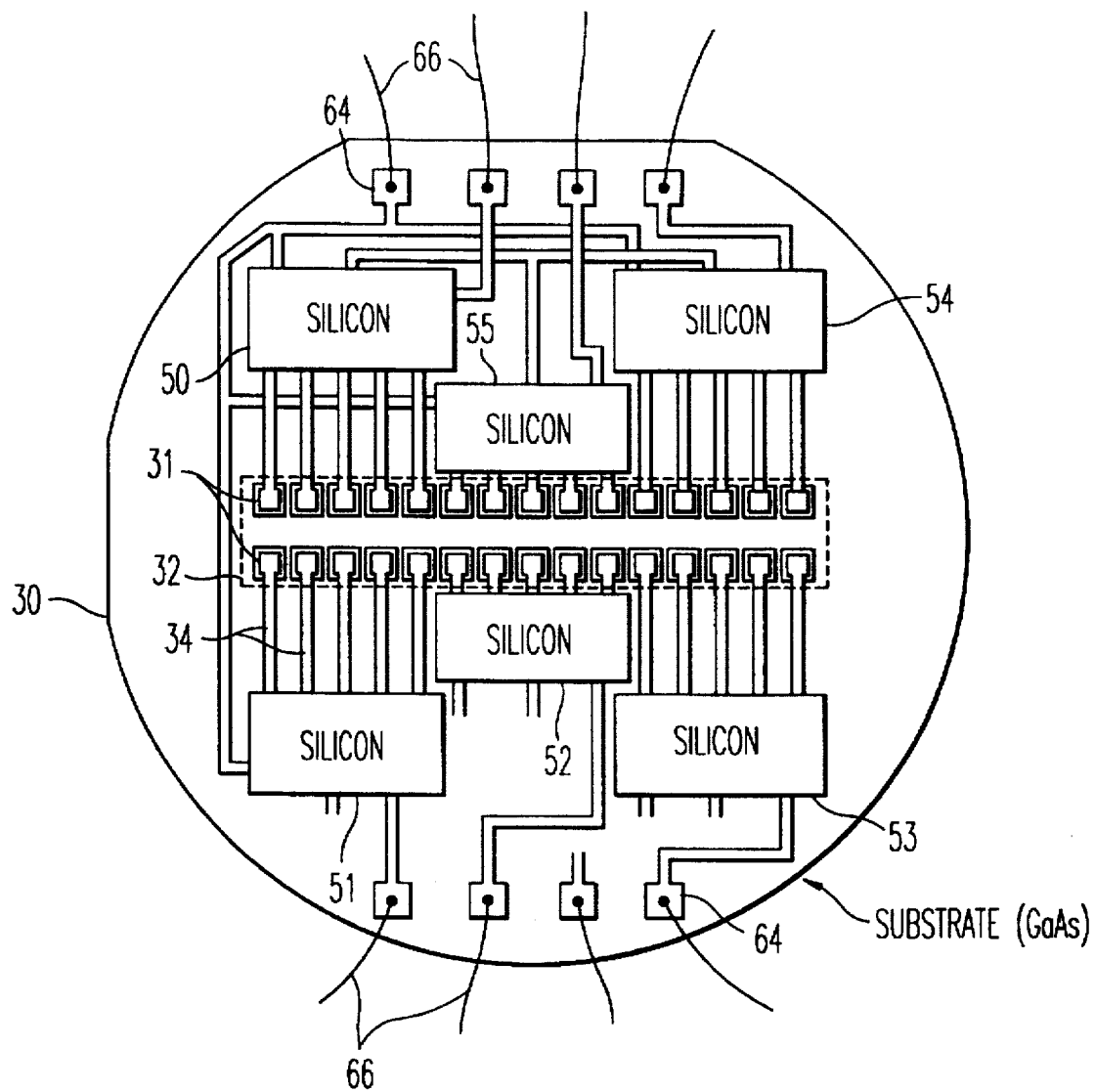
FIG. 3 illustrates a component according to the invention in plan view.

The hybrid semiconductor component produced by this technique is shown in FIG. 3. The silicon chips turned upside down are bonded via their front face to the front face of the main substrate 30, preferably by means of indium balls. The indium balls are produced conventionally by depositing a layer of indium on a substrate coated with an insulating layer which is open only above the contact pads. Next, the substrate is heated and the surface tension forces concentrate the indium into drops localized at the contact pads.

In FIG. 3, the wires for connection with the outside are designated by the reference 66. The package for the hybrid component has not been shown.

The silicon chips do not cover the input/output contacts 64. Although they do not cover the photosensitive area 32 either, it is possible to envisage, contrary to the normal case, the infrared detector component being illuminated via its front face, that is to say the face where the photosensitive elements 31 are integrated. It is therefore not necessary then to thin the GaAs or InP or HgCdTe, PbTe, etc. substrate. Thinning is a cause of brittleness and loss of yield. However, if a detection component to be illuminated via the front face is thus produced, it is necessary to ensure that the metallic connections 34 do not mask the photosensitive elements; conductors transparent at the wavelengths detected must be used, or else the contact points on these elements must occupy a small proportion of the working area of these elements.

In the diagrammatic representation in FIG. 2, it has been assumed that the contact pads 36 had dimensions and a spacing pitch which are identical to those of the active elements 31. However, the invention is particularly advantageous in that it enables the size and pitch of the photosensitive elements to be greatly reduced compared to as they were in the prior art.

Figure 4:
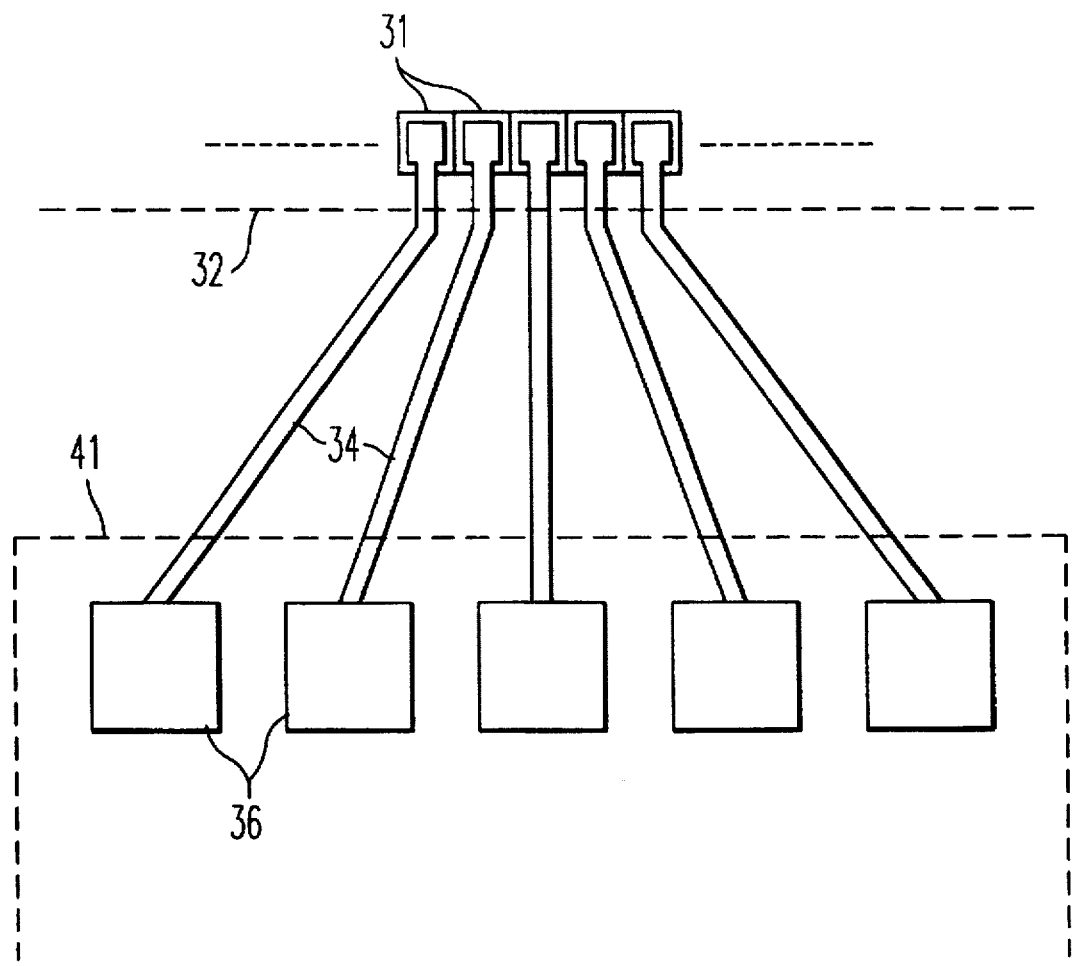
FIG. 4 illustrates the principle of a high-resolution component with active elements having a size and pitch which are much smaller than the size and pitch of the hybridization contact pads.

This is shown in FIG. 4, in which provision has been made for the size and pitch of the photosensitive pixels 31 to be much smaller than the size and pitch of the contact pads 36 to which they are connected. The dimensions of contact pads 36 are preferably at least 25 to 30 micrometers in width (this being generally necessary for bonding using indium balls). They are distributed in groups, each group corresponding to a respective silicon chip to be bonded to these pads. However, the photosensitive elements may remain all aligned with a constant, smaller, and even much smaller, pitch than the pitch of the contact pads 36.

Figure 5:
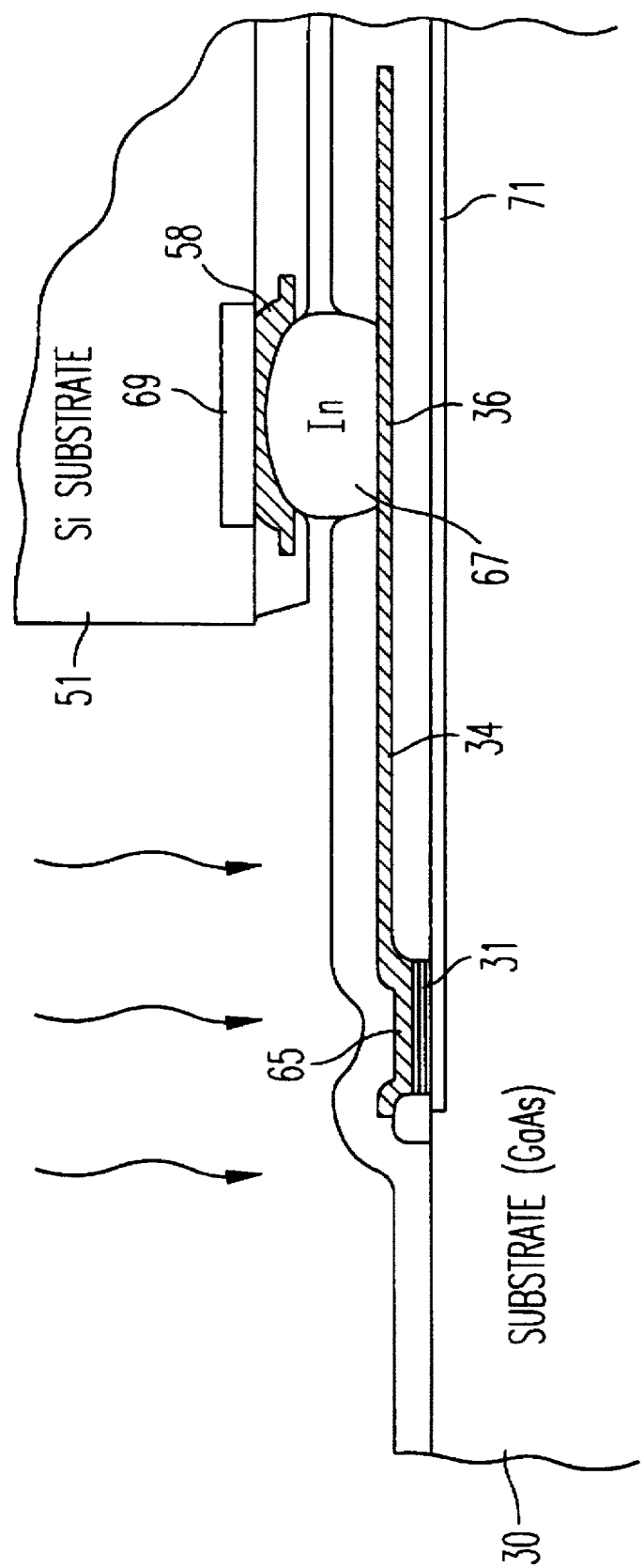
FIG. 5 represents, in section, a detail of an infrared detector which can be illuminated via the front face.

FIG. 5 shows, in section, an embodiment detail: visible here is the GaAs or InP hybridization main substrate 30, a photosensitive element 31 consisting of layers based on gallium arsenide, a top metallic contact 65 making it possible to connect the photosensitive element 31 to a contact pad 36 and therefore to a silicon chip 51 via a metallic connection 34; an indium ball 67 between the pad 36 and a pad 58 of the silicon chip. The read circuits of the silicon chip, which are produced using the normal techniques in microelectronics, are symbolized by a diffusion 69 into the silicon; a bottom contact layer 71, diffused into the surface of the substrate 30, makes it possible to gain access to the rear of the photosensitive element 31 which, in general, is a photodiode requiring a top contact and a bottom contact. This bottom layer 71 may be common to all the photosensitive elements of the substrate 30 and be connected via a contact, not shown, to the silicon circuits and to an input/output pad of the component. Finally, various insulating layers are, in general, necessary on the substrate 30 and on the silicon chips for the production of the component using normal techniques in microelectronics.

A single metallization level is shown in FIG. 5. However, it will be understood that if there are many interconnections between the main substrate 30 and the silicon chips, connection cross-overs will be inevitable and will require several metallization levels separated by insulating layers.

The hybrid semiconductor component according to the invention allows the use of semiconductor linear devices made of material other than silicon, having lengths significantly longer than about 10 mm, without butt-joining, when a corresponding semiconductor substrate of sufficient area is available.

Starting from an GaAs substrate for example, the diameter of which may reach 7.5 centimeters (3 inches), it is possible to produce a linear or multilinear infrared detection array several centimeters in length and having high resolution (more than one thousand points per line) by mounting several silicon chips of a few millimeters a side on the GaAs substrate.

We claim:

1. A hybrid semiconductor component comprising:

a main substrate made of a material other than silicon and having an inside surface area including an integrated array of a plurality of radiation responsive elements and a separate portion having a plurality of substrate contact pads with conductive connections being provided between at least some of the said radiation responsive elements and at least some of the substrate contact pads; and a plurality of silicon chips, each said silicon chip having an area smaller than that of the inside surface area of the main substrate and each said silicon chip containing at least one integrated circuit connected to chip contact pads, with at least some of the chip contact pads being bonded to facing ones of the substrate contact pads without any of said silicon chips overlying the integrated array of radiation responsive elements.

2. A hybrid component according to claim 1, wherein the radiation responsive elements of the main substrate are distributed along at least one line in said inside surface area and the respective substrate contact pads connected to said active elements are distributed in several groups located away from the inside surface area which contains said at least one line in said separate portion and, wherein each group of the several groups corresponds to a respective silicon chip with a size and pitch of the substrate contact pads in each said group being larger than a size and pitch of the corresponding active elements.

3. A hybrid component according to claim 1, wherein the radiation responsive elements are photosensitive elements.

4. A hybrid component according to claim 3, wherein the photosensitive elements are infrared elementary detectors.

5. A hybrid component according to claim 4, wherein the integrated array includes a linear or multilinear array of infrared detectors on the main substrate in said inside surface area and each of the plurality of silicon chips includes read circuits corresponding to each infrared detector in order to read charges generated by illumination of the infrared detectors.

6. A hybrid component according to claim 5, wherein the integrated array of infrared detectors is illuminated via a front face of the main substrate on which the integrated array of infrared detectors are provided and to which the plurality of silicon chips are bonded so as not to cover the infrared detectors.

7. A hybrid component according to claim 1, wherein the plurality of silicon chips have lateral dimensions of less than 10 millimeters on a side.

8. A hybrid component according to claim 1, wherein the plurality of silicon chips are bonded to the main substrate by means of indium balls formed on the facing substrate contact pads.

9. A hybrid component according to claim 1, wherein the main substrate is made of a semiconductor material selected from the group consisting of GaAs, InP, HgCdTe, and Pbte.

10. A hybrid component according to claim 1, further including a plurality of external connection pads for connecting said hybrid semiconductor component with other external devices, said external connection substrate pads being provided at a peripheral portion of said main substrate which is removed from the radiation responsive elements in the integrated array and the silicon chips.

11. A hybrid component according to claim 10, wherein said external connection pads are conductively connected to additional substrate contact pads bonded to the silicon chips.

12. A hybrid component according to claim 10, wherein the radiation responsive elements of the main substrate are distributed along at least one line in said inside surface area and the respective substrate contact pads connected to said radiation responsive elements are distributed in several groups located away from the inside surface area which contains said at least one line in said separate portion, and wherein each group of the several groups corresponds to a respective silicon chip with a size and pitch of the substrate contact pads in each said group being larger than a size and pitch of the corresponding radiation responsive elements.

13. A hybrid component according to claim 11, wherein the radiation responsive elements of the main substrate are distributed along at least one line in said inside surface area and the respective substrate contact pads connected to said radiation responsive elements are distributed in several groups located away from the inside surface area which contains said at least one line in said separate portion, and wherein each group of the several groups corresponds to a respective silicon chip with a size and pitch of the substrate contact pads in each said group being larger than a size and pitch of the corresponding radiation responsive elements.

14. A hybrid component according to claim 10, wherein the radiation responsive elements are photosensitive elements.

15. A hybrid component according to claim 11, wherein the radiation responsive elements are photosensitive elements.

16. A hybrid component according to claim 2, wherein the radiation responsive elements are photosensitive elements.

17. A hybrid component according to claim 14, wherein the photosensitive elements are infrared elementary detectors.

18. A hybrid component according to claim 15, wherein the photosensitive elements are infrared elementary detectors.

19. A hybrid component according to claim 16, wherein the photosensitive elements are infrared elementary detectors.

20. A hybrid component according to claim 5, wherein the integrated array of infrared detectors is illuminated via a front face of the main substrate on which the integrated array of infrared detectors are provided and to which the plurality of silicon chips are bonded so as not to cover the infrared detectors.

* * * * *